United States Patent
Eto et al.

(10) Patent No.: US 6,925,027 B2
(45) Date of Patent: Aug. 2, 2005

(54) SEMICONDUCTOR MEMORY

(75) Inventors: Satoshi Eto, Kawasaki (JP); Toshikazu Nakamura, Kawasaki (JP); Toshiya Miyo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 102 days.

(21) Appl. No.: 10/698,450

(22) Filed: Nov. 3, 2003

(65) Prior Publication Data

US 2004/0090846 A1 May 13, 2004

(30) Foreign Application Priority Data

Nov. 5, 2002 (JP) ........................................ 2002-321325

(51) Int. Cl.$^7$ ................................................. G11C 7/00
(52) U.S. Cl. .................. 365/229; 365/189.05; 365/226
(58) Field of Search ............................... 365/229, 226, 365/189.05, 233

(56) References Cited

U.S. PATENT DOCUMENTS 6,049,488 A * 4/2000 Sawada ................. 365/189.05
6,101,144 A * 8/2000 Jo ................................ 365/229
6,552,957 B2 * 4/2003 Yagishita ..................... 365/233
6,560,158 B2 * 5/2003 Choi et al. ................... 365/226
6,870,383 B2 * 3/2005 Kitazaki ..................... 324/763

FOREIGN PATENT DOCUMENTS

JP 11-317076 11/1999

* cited by examiner

Primary Examiner—Tan T. Nguyen
(74) Attorney, Agent, or Firm—Arent Fox PLLC (57) ABSTRACT

A semiconductor memory with a memory core for dynamically holding data in which a data collision at the time of the semiconductor memory making the transition from a standby state to a nonstandby state is prevented. A first buffer circuit inputs an enable signal for controlling a standby state or a nonstandby state. A second buffer circuit outputs a predetermined logic signal or a read/write signal for controlling the reading of data from or the writing of data to the memory core in accordance with the enable signal. A third buffer circuit outputs an inverted signal obtained by inverting the logic signal or the read/write signal in accordance with the enable signal. A control circuit controls the reading or writing of the data by the read/write signal outputted from the second buffer circuit. A data output control circuit controls the inputting of the data from or the outputting of the data to the outside by the inverted signal or the read/write signal outputted from the third buffer circuit.

7 Claims, 9 Drawing Sheets

SEMICONDUCTOR MEMORY

CROSS-REFERENCE TO RELATED APPLICATIONS

This application is based upon and claims the benefits of priority from the prior Japanese Patent Application No. 2002-321325, filed on Nov. 5, 2002, the entire contents of which are incorporated herein by reference.

BACKGROUND OF THE INVENTION (1) Field of the Invention

This invention relates to a semiconductor memory and, more particularly, to a semiconductor memory having a memory core for dynamically holding data.

(2) Description of the Related Art

Pseudostatic RAMs (PSRAMs) are semiconductor memories, in which a dynamic RAM (DRAM) core is used as a memory core (cell) and which have a static RAM (SRAM) interface.

Memory cores in PSRAMs have a DRAM structure. PSRAMs therefore can be fabricated at low cost compared with SRAMs. Unlike memory cores in SRAMs, however, memory cores in DRAMs can hold data only for a limited period of time and need the operation of rewriting data, which is called refresh. Moreover, because of destructive read out, special care is necessary to control memory cores in DRAMs. With SRAMs, such special care is unnecessary. With conventional PSRAMs, it has been difficult to reconcile all of this care with compatibility with SRAM interfaces. Accordingly, unlike ordinary SRAMs, various operational restrictions have been placed on PSRAMs. Though PSRAMs can be fabricated at low cost, these restrictions limit their use and they are not useful for users and manufacturers. Therefore, it is necessary to realize PSRAMs having an SRAM compatible interface by removing these restrictions.

Products which bear FCRAM (registered trademark) are PSRAMs. Specifications for FCRAMs include restrictions which are not placed on ordinary SRAMs. For example, when an FCRAM is in a standby state (a state in which data cannot be read or written, that is to say, an inactive state), predetermined voltages must be inputted to address terminals and control terminals, such as chip enable terminals and read/write terminals.

With ordinary SRAMs, only voltages to be inputted to chip enable terminals are specified and voltages to be inputted to the other terminals are not specified.

Figure 7:
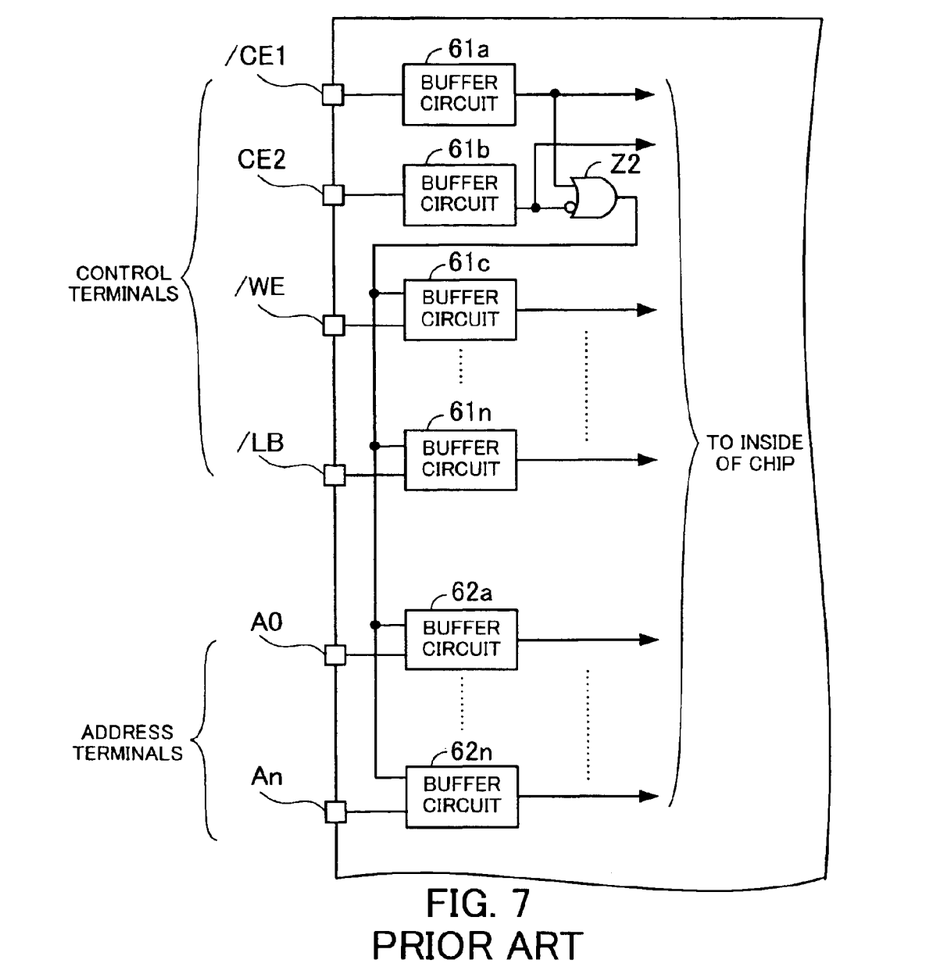
FIG. 7 is a view showing the circuit structure of a conventional PSRAM.

As stated above, the restriction has been placed on PSRAMs. That is to say, at standby time voltages must be inputted from the outside. To remove this restriction, a circuit for holding a predetermined signal (voltage) state and outputting it to the inside should be included. FIG. 7 is a view showing the circuit structure of a conventional PSRAM. As shown in FIG. 7, a PSRAM includes buffer circuits 61a through 61n, buffer circuits 62a through 62n, terminals /CE1 and CE2 and terminals /WE through /LB, being control terminals, terminals A0 through An, being address terminals, and an OR circuit Z2.

The buffer circuits 61a and 61b amplify signals inputted to the terminals /CE1 and CE2, respectively, so that they can drive circuits in the PSRAM.

The buffer circuits 61c through 61n amplify signals inputted to the terminals /WE through /LB, respectively, according to the state of signals inputted to the buffer circuits 61a and 61b (according to the state of a signal outputted from the OR circuit Z2) so that they can drive circuits in the PSRAM. When a signal outputted from the OR circuit Z2 is in the "L" state, the buffer circuits 62a through 62n amplify signals inputted to the terminals A0 through An respectively.

A signal for putting the PSRAM into a standby (inactive) state or a nonstandby (active) state is inputted to the terminal /CE1 or CE2. When a signal in the "H" state is inputted to the terminal /CE1 or when a signal in the "L" state is inputted to the terminal CE2, the PSRAM will go into a standby state.

A signal for controlling the reading or writing of data is inputted to the terminal /WE. When a signal in the "L" state is inputted to the terminal /WE, the PSRAM will go into a state in which data can be written thereto. When a signal in the "H" state is inputted to the terminal /WE, the PSRAM will output data it stores.

A signal for controlling the width of outputted (read) data (for exercising byte control) is inputted to the terminal /LB. For example, when a signal in the "L" state is inputted to the terminal /LB, only the eight low order bits of data will be outputted.

(Write) address signals for writing data and (read) address signals for reading data are inputted to the terminals A0 through An.

The OR circuit Z2 performs an OR operation on signals outputted from the buffer circuits 61a and 61b and outputs a result to the buffer circuits 61c through 61n and the buffer circuits 62a through 62n. When a signal in the "L" state is inputted from the buffer circuit 61a and a signal in the "H" state is inputted from the buffer circuit 61b (when the PSRAM is in a nonstandby state), the OR circuit Z2 will output a signal in the "L" state.

When a signal in the "H" state is inputted to the terminal /CE1 or a signal in the "L" state is inputted to the terminal CE2, the PSRAM will go into a standby state. At this time the PSRAM will not read or write data even when a signal in the "H" or "L" state is inputted to the terminal /WE. The reason for this is that a signal in the "H" state is outputted from the OR circuit Z2 and that the buffer circuits 61c through 61n and the buffer circuits 62a through 62n will not amplify a signal.

When a signal in the "L" state is inputted to the terminal /CE1 and a signal in the "H" state is inputted to the terminal CE2, the PSRAM will go into a nonstandby state. A signal in the "L" state is outputted from the OR circuit Z2 and the buffer circuits 61c through 61n and the buffer circuits 62a through 62n will go into an amplifiable state. Then the PSRAM will read or write data when a signal in the "H" or "L" state is inputted to the terminal /WE. The PSRAM will read data from or write data to an address indicated by address signals which are being inputted to the terminals A0 through An.

Figure 8:
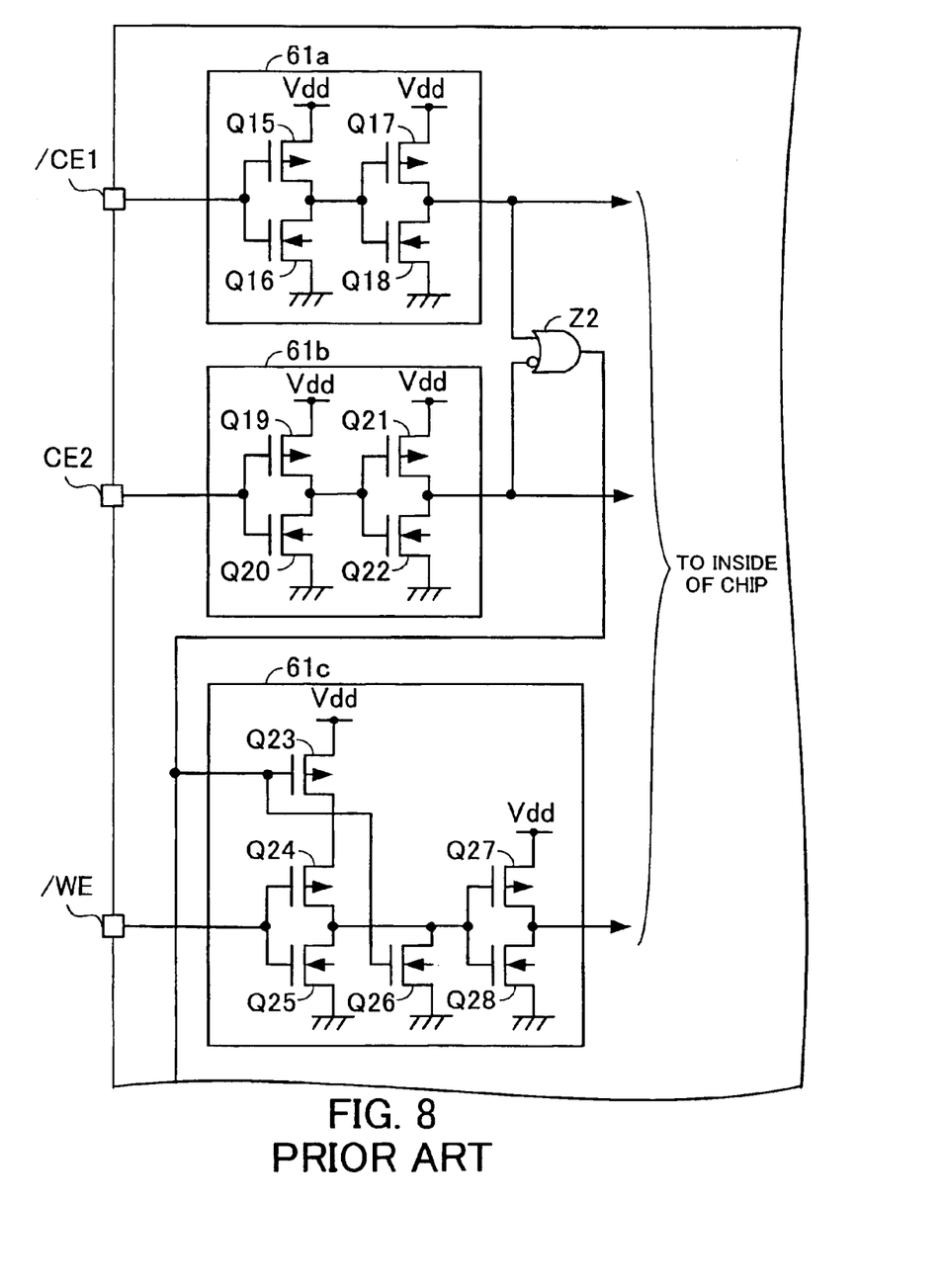
FIG. 8 is a circuit diagram showing the details of the buffer circuits.

FIG. 8 is a circuit diagram showing the details of the buffer circuits. As shown in FIG. 8, the buffer circuit 61a includes transistors Q15 and Q17, being p-channel MOS transistors, and transistors Q16 and Q18, being n-channel MOS transistors. The transistors Q15 and Q16 make up an inverter circuit. The transistors Q17 and Q18 also make up an inverter circuit. The structure of the buffer circuit 61b is the same as that of the buffer circuit 61a, so a detailed description of it will be omitted.

The buffer circuit 61c includes transistors Q23, Q24 and Q27, being p-channel MOS transistors, and transistors Q25, Q26 and Q28, being n-channel MOS transistors. The transistors Q24 and Q25 make up an inverter circuit. The transistors Q27 and Q28 also make up an inverter circuit. When a signal in the "L" state is inputted from the OR circuit Z2, the transistor Q23 supplies power supply voltage Vdd to the inverter circuit made up of the transistors Q24 and Q25 and puts it into an operable state. When a signal in the "H" state is inputted from the OR circuit Z2, the transistor Q26 outputs ground voltage (a signal in the "L" state) to the inverter circuit made up of the transistors Q27 and Q28. The structure of the buffer circuits 61d through 61n and the buffer circuits 62a through 62n (not shown) is the same as that of the buffer circuit 61c.

That is to say, when the PSRAM is in a standby state, a signal kept in the "H" state will be outputted from the buffer circuits 61c through 61n and the buffer circuits 62a through 62n to the inside of the PSRAM regardless of the state of signals which are being inputted to the terminals /WE through /LB, being control terminals, and the terminals A0 through An, being address terminals. As a result, it is unnecessary to input voltage to the control terminals and the address terminals at the time of the PSRAM being in a standby state. Therefore, a PSRAM, which is not subject to the above restriction and which has an SRAM compatible interface, can be realized.

By the way, semiconductor integrated circuits in which a buffer circuit is used include the one comprising a detection circuit for detecting whether an external control signal clock is functioning and an input buffer for accepting an external control signal clock and outputting an internal control signal on the basis of the result of detection by the detection circuit (see, for example, Japanese Unexamined Patent Publication No. 11-317076, pp. 2–3 and FIG. 1).

A signal inputted to the terminal /CE1 is inputted to the buffer circuits 61c through 61n and the buffer circuits 62a through 62n via the buffer circuit 61a and the OR circuit Z2. A signal inputted to the terminal CE2 is inputted to the buffer circuits 61c through 61n and the buffer circuits 62a through 62n via the buffer circuit 61b and the OR circuit Z2. A signal inputted to the terminal /CE1 is delayed by the buffer circuit 61a and the OR circuit Z2 and is outputted to the buffer circuits 61c through 61n and the buffer circuits 62a through 62n. A signal inputted to the terminal CE2 is delayed by the buffer circuit 61b and the OR circuit Z2 and is outputted to the buffer circuits 61c through 61n and the buffer circuits 62a through 62n. Therefore, a signal, which is being inputted to the terminal /WE and which is amplified and outputted by the buffer circuit 61c, will be delayed. This signal will also be delayed by the buffer circuit 61c itself. Actually, this signal will be delayed further not only by transistors but also by, for example, a delay element (not shown) inserted to filter a signal glitch and the like.

Figure 9:
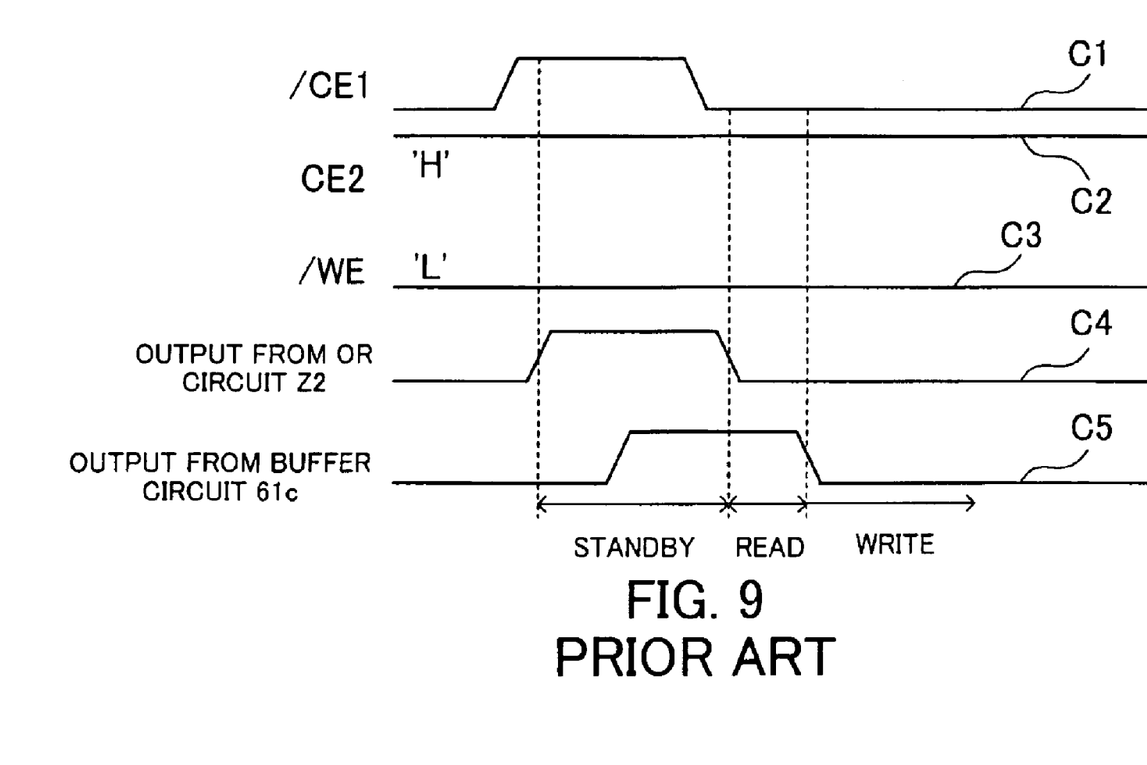
FIG. 9 is a view showing timing inside the PSRAM.

FIG. 9 is a view showing timing inside the PSRAM. A waveform C1 shown in FIG. 9 indicates the waveform of a signal which is being inputted to the terminal /CE1. A waveform C2 indicates the waveform of a signal which is being inputted to the terminal CE2. A waveform C3 indicates the waveform of a signal which is being inputted to the terminal /WE. A waveform C4 indicates the waveform of a signal which is being outputted from the OR circuit Z2. A waveform C5 indicates the waveform of a signal outputted from the buffer circuit 61c.

As shown by the waveforms C1 and C2, it is assumed that the signal in the "H" state is inputted to the terminal /CE1 and that the signal in the "H" state is inputted to the terminal CE2 (the PSRAM is in a standby state). As shown by the waveform C4, the transition of the state of the signal outputted from the OR circuit Z2 will lag behind the transition of the state of the signal inputted to the terminal /CE1 by the buffer circuits 61a and 61b and the OR circuit Z2. Moreover, as shown by the waveform C5, the transition of the state of the signal outputted from the buffer circuit 61c will be delayed by the buffer circuit 61c itself.

As shown by the waveform C3, a signal in the "L" state for writing data is being inputted to the terminal /WE when the PSRAM makes the transition from a standby state to a nonstandby state (when the signal which is being inputted to the terminal /CE1 makes the transition to the "L" state). As shown by the waveform C5, then the signal in the "L" state is outputted to the inside of the PSRAM after some delay.

When the PSRAM makes the transition from a standby state to a nonstandby state, the operation of writing data is being performed outside the PSRAM. Inside the PSRAM, however, read operation will be performed because of a signal delay as shown by the waveform C5. This will cause a data collision.

SUMMARY OF THE INVENTION

The present invention was made under the background circumstances as described above. An object of the present invention is to provide a semiconductor memory in which a data collision at the time of making the transition from a standby state to a nonstandby state is prevented.

In order to achieve the above object, a semiconductor memory having a memory core for dynamically holding data is provided. This semiconductor memory comprises a first buffer circuit for inputting an enable signal for controlling a standby state or a nonstandby state, a second buffer circuit for outputting a predetermined logic signal or a read/write signal for controlling the reading of data from or the writing of data to the memory core in accordance with the enable signal, a third buffer circuit for outputting an inverted signal obtained by inverting the logic signal or the read/write signal in accordance with the enable signal, a control circuit for controlling the reading or writing of the data by the logic signal or the read/write signal outputted from the second buffer circuit, and a data output control circuit for controlling the inputting of the data from or the outputting of the data to the outside by the inverted signal or the read/write signal outputted from the third buffer circuit.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
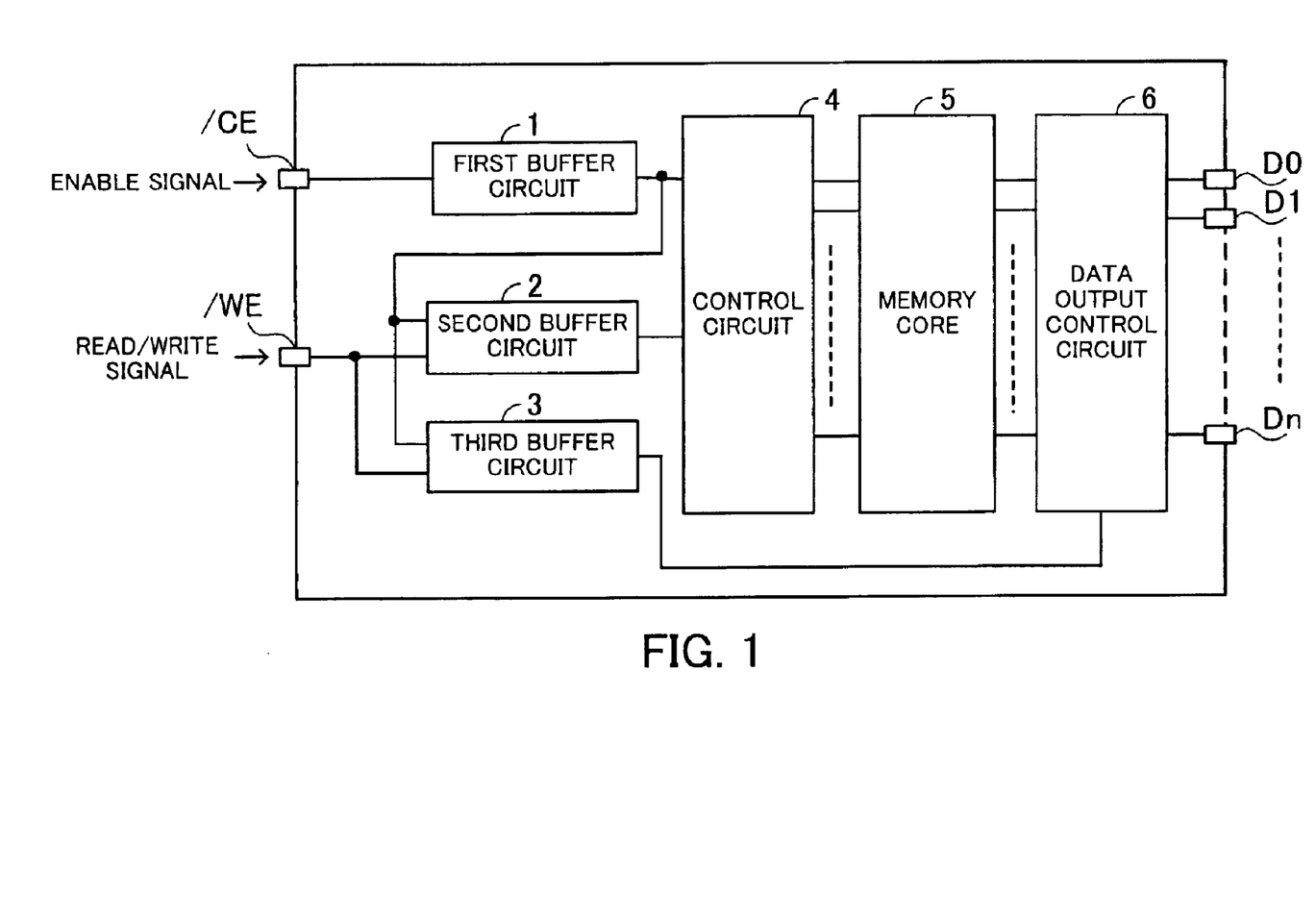
FIG. 1 is a view for describing the principles underlying the present invention.

FIG. 1 is a view for describing the principles underlying the present invention. As shown in FIG. 1, a semiconductor memory comprises a first buffer circuit 1, a second buffer circuit 2, a third buffer circuit 3, a control circuit 4, a memory core 5, a data output control circuit 6, a terminal /CE, a terminal /WE, and terminals D0 through Dn.

An enable signal for exercising control over the semiconductor memory to put it into a standby or nonstandby state is inputted to the terminal /CE. A read/write signal for exercising control over the reading or writing of data is inputted to the terminal /WE. Data to be stored is inputted from the outside to the terminals D0 through Dn or data stored in the memory core 5 is outputted to the terminals D0 through Dn.

The first buffer circuit 1 inputs an enable signal from the terminal /CE. The first buffer circuit 1 outputs the enable signal it accepted to the second buffer circuit 2, the third buffer circuit 3, and the control circuit 4.

The second buffer circuit 2 outputs a predetermined logic signal or a read/write signal inputted to the terminal /WE to the control circuit 4 in accordance with an enable signal outputted from the first buffer circuit 1. To be concrete, while an enable signal for controlling a standby state is being inputted, the second buffer circuit 2 outputs a certain logic signal in the "H" or "L" state. When an enable signal for controlling a nonstandby state is inputted, the second buffer circuit 2 outputs a read/write signal.

The third buffer circuit 3 outputs an inverted signal obtained by inverting a logic signal which is being outputted from the second buffer circuit 2 or a read/write signal inputted to the terminal /WE to the data output control circuit 6. To be concrete, when an enable signal for controlling a standby state is inputted, the third buffer circuit 3 outputs an inverted signal obtained by inverting a logic signal which is being outputted from the second buffer circuit 2. When an enable signal for controlling a nonstandby state is inputted, the third buffer circuit 3 outputs a read/write signal.

The control circuit 4 exercises control over the reading of data from or the writing of data to the memory core 5 in accordance with an enable signal outputted from the first buffer circuit 1 and a read/write signal outputted from the second buffer circuit 2.

The memory core 5 has a DRAM structure and holds data dynamically.

The data output control circuit 6 exercises control over the inputting of data from or the outputting of data to the outside in accordance with an inverted signal or a read/write signal outputted from the third buffer circuit 3. For example, when a write signal for writing data is inputted, the data output control circuit 6 outputs data inputted to the terminals D0 through Dn to the memory core 5. When a read signal for reading data is inputted, the data output control circuit 6 outputs data stored in the memory core 5 to the terminals D0 through Dn.

Operation in FIG. 1 will now be described.

It is assumed that an enable signal for controlling a nonstandby state is inputted to the terminal /CE. Then the first buffer circuit 1 outputs this enable signal to the second buffer circuit 2, the third buffer circuit 3, and the control circuit 4.

The second buffer circuit 2 outputs a read/write signal inputted to the terminal /WE to the control circuit 4 in accordance with the enable signal for controlling a nonstandby state.

The third buffer circuit 3 outputs the read/write signal which is being inputted to the terminal /WE to the data output control circuit 6 in accordance with the enable signal for controlling a nonstandby state.

As a result, in a nonstandby state, data will be inputted to or outputted from the memory core 5 in accordance with the read/write signal inputted to the terminal /WE and the inputting of the data from or the outputting of the data to the outside will be controlled by the data output control circuit 6.

When an enable signal for controlling a standby state is inputted to the terminal /CE, the second buffer circuit 2 outputs a predetermined logic signal to the control circuit 4 in accordance with the enable signal for controlling a standby state. This makes it unnecessary to input a predetermined voltage from a terminal at the time of the semiconductor memory being in a standby state and enables the semiconductor memory to have an interface which is the same as the one for an ordinary SRAM.

The third buffer circuit 3 outputs an inverted signal obtained by inverting the logic signal which is being outputted from the second buffer circuit 2 to the data output control circuit 6.

It is assumed that the logic signal outputted from the second buffer circuit 2 at the time of the semiconductor memory being in a standby state corresponds to a read signal. Moreover, it is assumed that the controlling of a standby state shifts to the controlling of a nonstandby state outside the semiconductor memory, that an enable signal for controlling a nonstandby state is inputted to the terminal /CE, and that a write signal is inputted to the terminal /WE. At this time the operation of writing data is being performed outside the semiconductor memory. However, the outputting of the write signal to the control circuit 4 will be delayed because of the enable signal being delayed in the first buffer circuit 1 and a delay in the second buffer circuit 2 itself. Accordingly, the read signal will be inputted to the control circuit 4. Then data read from the memory core 5 will be outputted, resulting in a bus fight (collision) with external data written. However, a write signal obtained by inverting the read signal is being inputted to the data output control circuit 6, so the data read from the memory core 5 will not be outputted to the terminals D0 through Dn. This prevents a bus fight which may otherwise be caused by signal delays.

Figure 2:
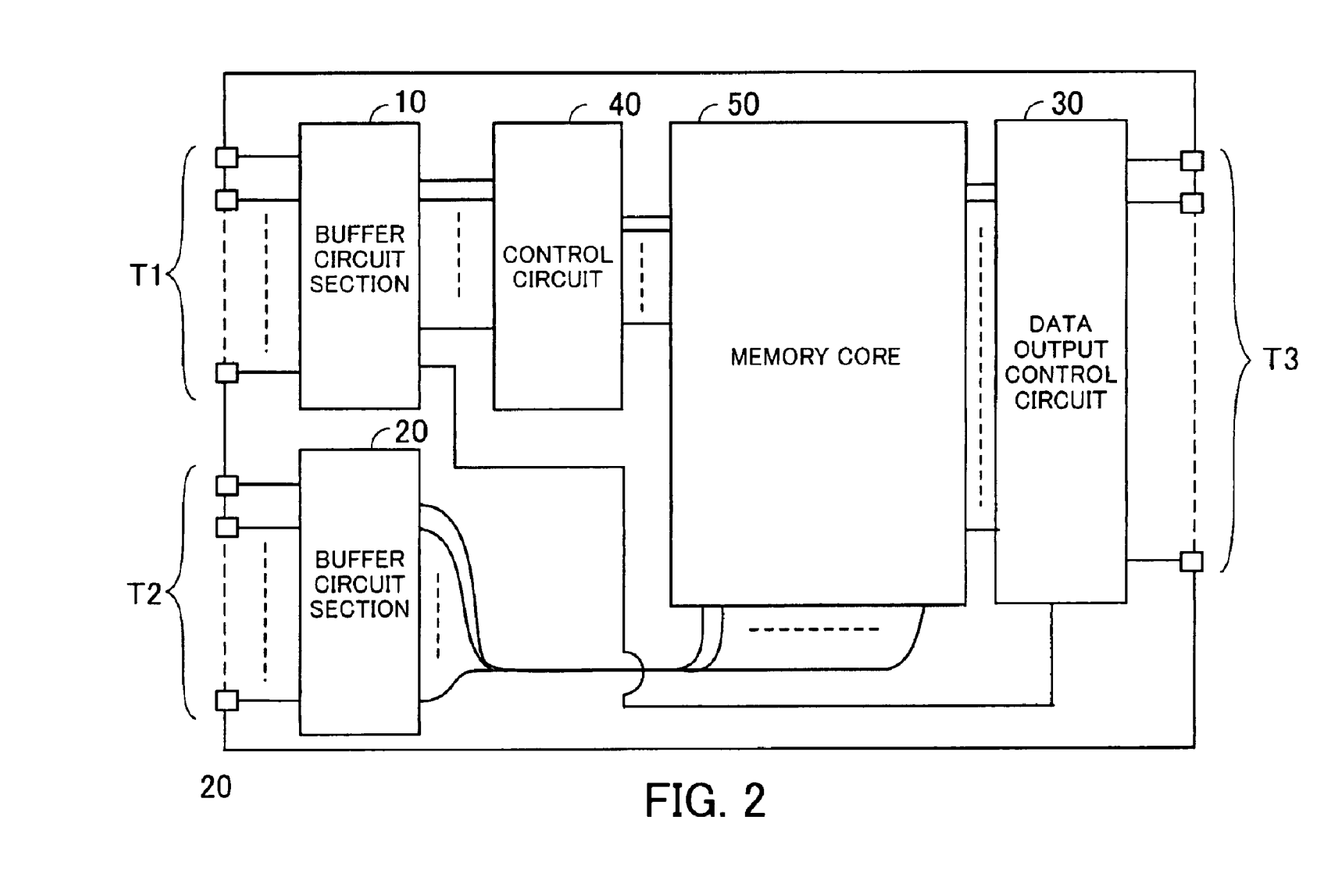
FIG. 2 is a view showing the circuit structure of a PSRAM according to an embodiment of the present invention.

FIG. 2 is a view showing the circuit structure of a PSRAM according to an embodiment of the present invention. As shown in FIG. 2, a PSRAM comprises a control terminal group T1, an address terminal group T2, a data terminal group T3, buffer circuit sections 10 and 20, a data output control circuit 30, a control circuit 40, and a memory core 50.

Control signals regarding control, such as signals for specifying a standby or nonstandby state and signals for controlling the reading or writing of data, are inputted to the control terminal group T1.

Address data for specifying an address where data is to be read or written is inputted to the address terminal group T2.

Data is inputted from the outside to the data terminal group T3 and data is outputted from the data terminal group T3 to the outside.

The buffer circuit section 10 is a circuit group for amplifying control signals inputted to the control terminal group T1.

The buffer circuit section 20 is a circuit group for amplifying address data inputted to the address terminal group T2.

The data output control circuit 30 controls the passage or shutdown of data between the memory core 50 and the data terminal group T3 in accordance with control signals inputted to the control terminal group T1.

The control circuit 40 controls the inputting or outputting of data stored in the memory core 50 in accordance with control signals inputted to the control terminal group T1.

The memory core 50 has a DRAM structure and holds data dynamically. Under the control of the control circuit 40, the memory core 50 stores data or outputs data it stores.

Figure 3:
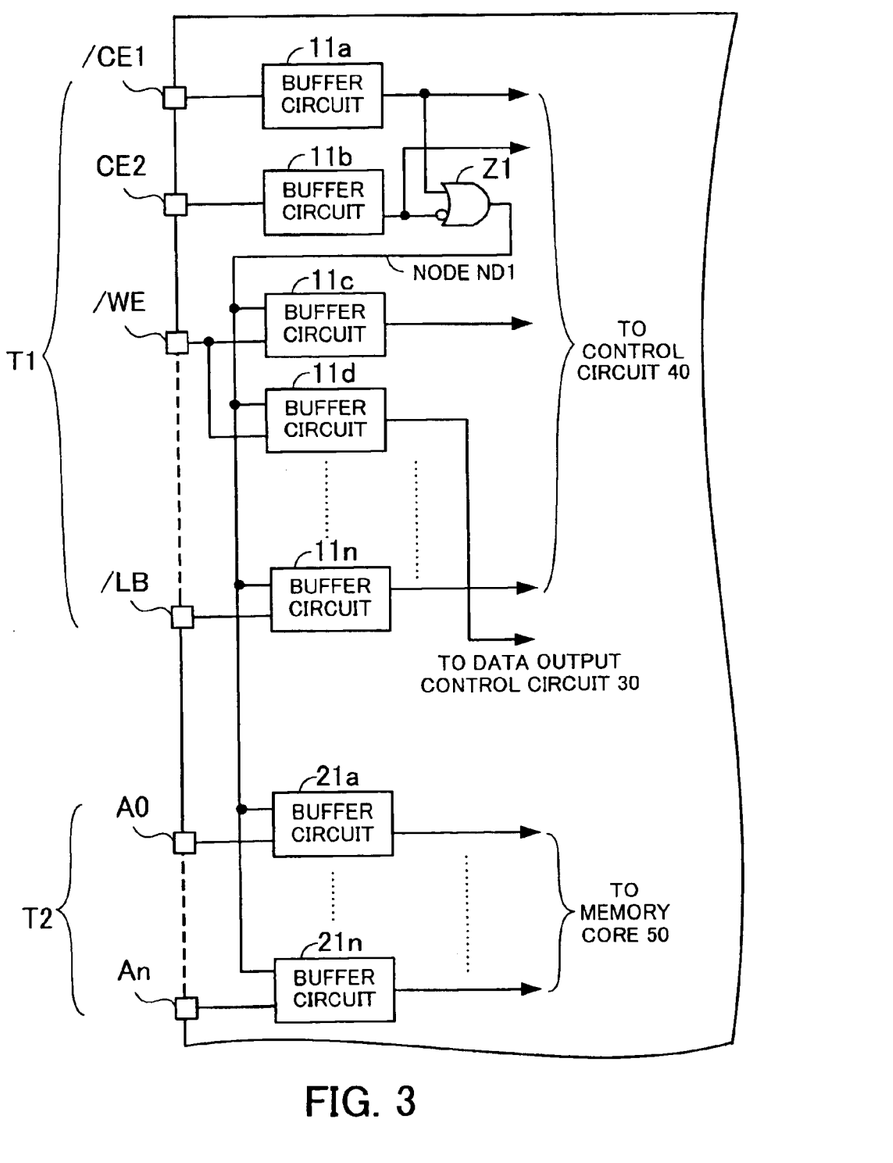
FIG. 3 is a circuit diagram showing the details of part of the control terminal group, the address terminal group, and the buffer circuit sections shown in FIG. 2.

FIG. 3 is a circuit diagram showing the details of part of the control terminal group, the address terminal group, and the buffer circuit sections shown in FIG. 2. Terminals /CE1, CE2, and/WE through /LB shown in FIG. 3 correspond to the control terminal group T1 shown in FIG. 2. Terminals A0 through An shown in FIG. 3 correspond to the address terminal group T2 shown in FIG. 2. Buffer circuits 11a through 11n shown in FIG. 3 correspond to the buffer circuit section 10 shown in FIG. 2. Buffer circuits 21a through 21n shown in FIG. 3 correspond to the buffer circuit section 20 shown in FIG. 2.

An enable signal for putting the PSRAM into a standby or nonstandby state is inputted to the terminal /CE1 or CE2. When a signal in the "H" state is inputted to the terminal /CE1 or when a signal in the "L" state is inputted to the terminal CE2, the PSRAM will go into a standby state.

A write signal for controlling the writing of data to the memory core 50 or a read signal for controlling the reading of data from the memory core 50 is inputted to the terminal /WE. When a signal in the "L" state is inputted to the terminal /WE, data will be written to the memory core 50. When a signal in the "H" state is inputted to the terminal /WE, data stored in the memory core 50 will be outputted.

A signal for controlling the width of outputted data (for exercising byte control) is inputted to the terminal /LB. For example, when a signal in the "L" state is inputted to the terminal /LB, signals indicative of only the eight low order bits of data will be outputted from the memory core 50.

Address signals for writing data to the memory core 50 or address signals for reading data from the memory core 50 are inputted to the terminals A0 through An.

The buffer circuits 11a and 11b amplify enable signals. inputted to the terminals /CE1 and CE2, respectively, so that they can drive the control circuit 40. Signals outputted from the buffer circuits 11a and 11b are inputted not only to the control circuit 40 but also to the buffer circuits 11c through 11n and 21a through 21n via an OR circuit Z1.

The OR circuit Z1 performs an OR operation on signals outputted from the buffer circuits 11a and 11b and outputs a result to the buffer circuits 11c through 11n and 21a through 21n. When a signal in the "L" state is inputted from the buffer circuit 11a and a signal in the "H" state is inputted from the buffer circuit 11b, the OR circuit Z1 will output a signal in the "L" state. That is to say, when the PSRAM is in a nonstandby state, the OR circuit Z1 will output a signal in the "L" state. When the PSRAM is in a standby state, the OR circuit Z1 will output a signal in the "H" state.

The buffer circuits 11c through 11n (excluding the buffer circuit 11d) amplify signals inputted to the terminals /WE through /LB, respectively, according to the state of signals inputted to the buffer circuits 11a and 11b (according to the state of a signal outputted from the OR circuit Z1) so that they can drive the control circuit 40, and output them to the control circuit 40. When a signal in the "L" state is outputted from the OR circuit Z1, the buffer circuits 11c through 11n (excluding the buffer circuit 11d) amplify signals inputted to the terminals /WE through /LB, respectively, and output them. When a signal in the "H" state is inputted, the buffer circuits 11c through 11n (excluding the buffer circuit 11d) output a signal in the "H" state regardless of the state of signals inputted to the terminals /WE through /LB respectively.

When a signal in the "L" state is outputted from the OR circuit Z1, the buffer circuit 11d amplifies a signal inputted to the terminal /WE and outputs it to the data output control circuit 30. When a signal in the "H" state is inputted, the buffer circuit 11d outputs a signal in the "L" state to the data output control circuit 30 regardless of the state of a signal inputted to the terminal /WE. When a signal in the "H" state is inputted, the data output control circuit 30 outputs data outputted from the memory core 50 to the terminals D0 through Dn. However, when a signal in the "L" state is inputted, the data output control circuit 30 does not output data outputted from the memory core 50 to the terminals D0 through Dn.

The buffer circuits 21a through 21n output signals inputted to the terminals A0 through An, respectively, to the memory core 50 according to the state of signals inputted to the buffer circuits 11a and 11b (according to the state of a signal outputted from the OR circuit Z1). When a signal in the "L" state is outputted from the OR circuit Z1, the buffer circuits 21a through 21n amplify signals inputted to the terminals A0 through An, respectively, and output them to the memory core 50. When a signal in the "H" state is outputted from the OR circuit Z1, the buffer circuits 21a through 21n output a signal in the "H" state to the memory core 50 regardless of the state of signals inputted to the terminal A0 through An respectively.

Figure 4:
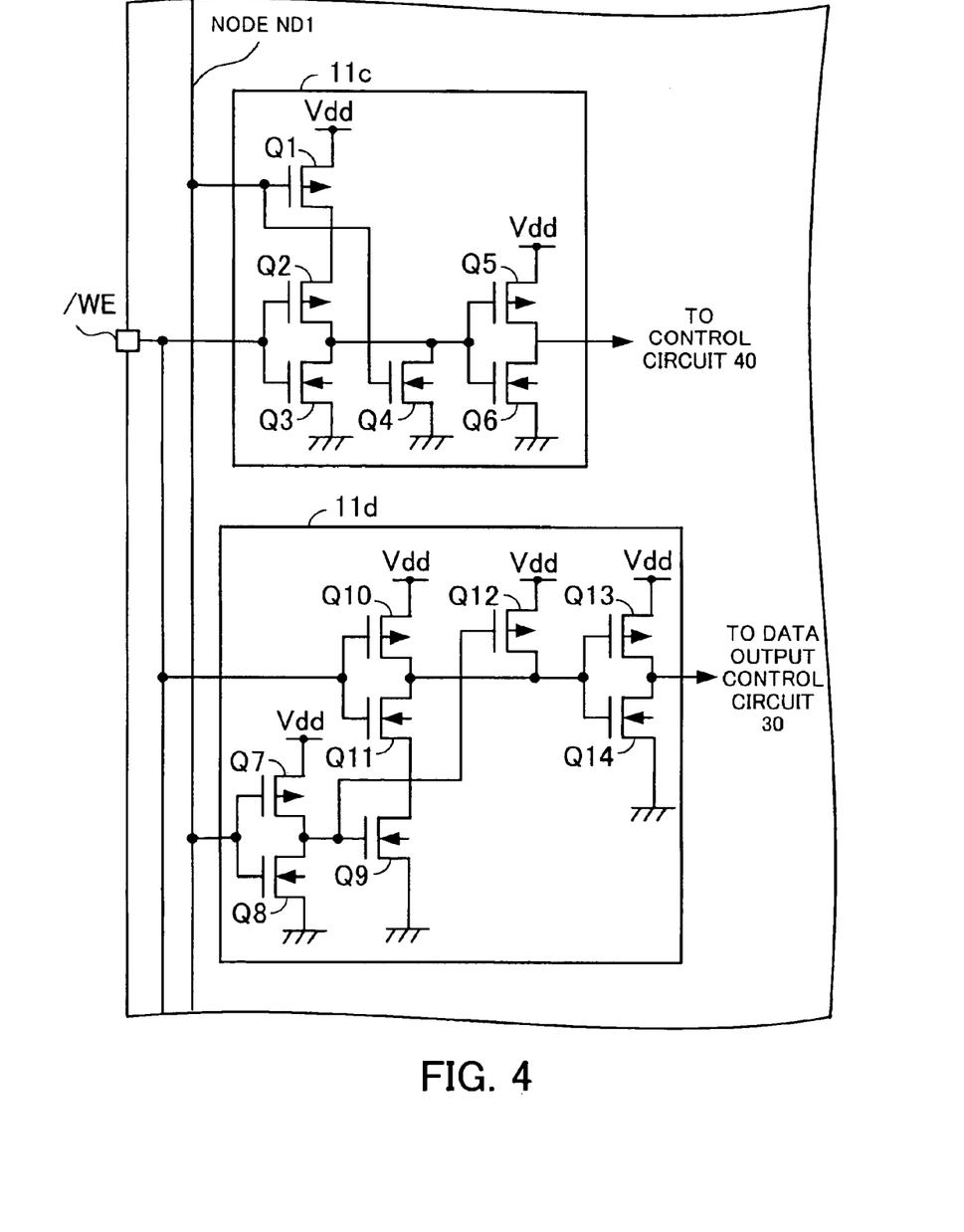
FIG. 4 is a circuit diagram showing the details of the buffer circuits.

FIG. 4 is a circuit diagram showing the details of the buffer circuits. As shown in FIG. 4, the buffer circuit 11c includes transistors Q1, Q2 and Q5, being p-channel MOS transistors, and transistors Q3, Q4 and Q6, being n-channel MOS transistors. A node ND1 shown in FIG. 4 is connected to the output side of the OR circuit Z1 shown in FIG. 3.

A gate of the transistor Q1 is connected to the node ND1. A source of the transistor Q1 is connected to power supply Vdd.

The transistors Q2 and Q3 make up an inverter circuit. Gates of the transistors Q2 and Q3 are connected to the terminal /WE. A source of the transistor Q2 is connected to a drain of the transistor Q1.

A gate of the transistor Q4 is connected to the node ND1. A drain of the transistor Q4 is connected to drains of the transistors Q2 and Q3. A source of the transistor Q4 is connected to the ground.

The transistors Q5 and Q6 make up an inverter circuit. Gates of the transistors Q5 and Q6 are connected to the drains of the transistors Q2, Q3 and Q4. Drains of the transistors Q5 and Q6 are connected to the control circuit 40.

As a result, when the node ND1 is in the "L" state, that is to say, when the PSRAM is in a nonstandby state, the transistor Q1 turns on and the transistors Q2 and Q3 go into an operating state. The transistors Q2 and Q3 invert a signal which is being inputted to the terminal /WE and output the signal to the transistors Q5 and Q6. The transistors Q5 and Q6 invert the signal again and output it to the control circuit 40.

When the node ND1 is in the "H" state, that is to say, when the PSRAM is in a standby state, the transistor Q1 turns off and the transistors Q2 and Q3 do not operate. The transistor Q4 turns on and the gates of the transistors Q5 and Q6 are connected to the ground. The transistors Q5 and Q6 invert a signal in the "L" state and output a signal in the "H" state.

That is to say, when an enable signal for specifying a nonstandby state is inputted to each of the terminals /CE1 and CE2, the buffer circuit 11c amplifies a signal inputted to the terminal /WE and outputs it to the control circuit 40.

Conversely, when an enable signal for specifying a standby state is inputted to each of the terminals /CE1 and CE2, the buffer circuit 11c outputs a signal in the "H" state to the control circuit 40 regardless of the state of a signal inputted to the terminal /WE. This makes it unnecessary to specify voltage from the terminal /WE at the time of the PSRAM being in a standby state.

The buffer circuit 11d includes p-channel MOS transistors Q7, Q10, Q12 and Q13 and n-channel MOS transistors Q8, Q9, Q11 and Q14.

The transistors Q7 and Q8 make up an inverter circuit. Gates of the transistors Q7 and Q8 are connected to the node ND1.

A gate of the transistor Q9 is connected to drains of the transistors Q7 and Q8. A source of the transistor Q9 is connected to the ground.

The transistors Q10 and Q11 make up an inverter circuit. Gates of the transistors Q10 and Q11 are connected to the terminal /WE. A source of the transistor Q10 is connected to the power supply Vdd. A source of the transistor Q11 is connected to a drain of the transistor Q9.

A gate of the transistor Q12 is connected to the drains of the transistors Q7 and Q8. A source of the transistor Q12 is connected to the power supply Vdd. A drain of the transistor Q12 is connected to drains of the transistors Q10 and Q11.

The transistors Q13 and Q14 makeup an inverter circuit. Gates of the transistors Q13 and Q14 are connected to the drains of the transistors Q10 and Q11 and the drain of the transistor Q12. Drains of the transistors Q13 and Q14 are connected to the data output control circuit 30.

As a result, when the node ND1 is in the "L" state, that is to say, when the PSRAM is in a nonstandby state, the transistor Q9 turns on and the transistors Q10 and Q11 go into an operating state. The transistors Q10 and Q11 invert a signal which is being inputted to the terminal /WE and output the signal to the transistors Q13 and Q14. The transistors Q13 and Q14 invert the signal again and output it to the data output control circuit 30.

When the node ND1 is in the "H" state, that is to say, when the PSRAM is in a standby state, the transistor Q9 turns off and the transistors Q10 and Q11 do not operate. The transistor Q12 turns on and the gates of the transistors Q13 and Q14 are connected to the power supply Vdd. The transistors Q13 and Q14 invert a signal in the "H" state and output a signal in the "L" state.

That is to say, when an enable signal for specifying a nonstandby state is inputted to each of the terminals /CE1 and CE2, the buffer circuit 11d amplifies a signal inputted to the terminal /WE and outputs it to the data output control circuit 30.

Conversely, when an enable signal for specifying a standby state is inputted to each of the terminals /CE1 and CE2, the buffer circuit 11d outputs a signal in the "L" state to the data output control circuit 30 regardless of the state of a signal inputted to the terminal /WE. Accordingly, when the PSRAM is in a standby state, the state ("L") of a signal the buffer circuit 11d outputs to the data output control circuit 30 is opposite to that of a signal the buffer circuit 11c is outputting.

The operation of the PSRAM will now be described by the use of timing charts.

Figure 5:
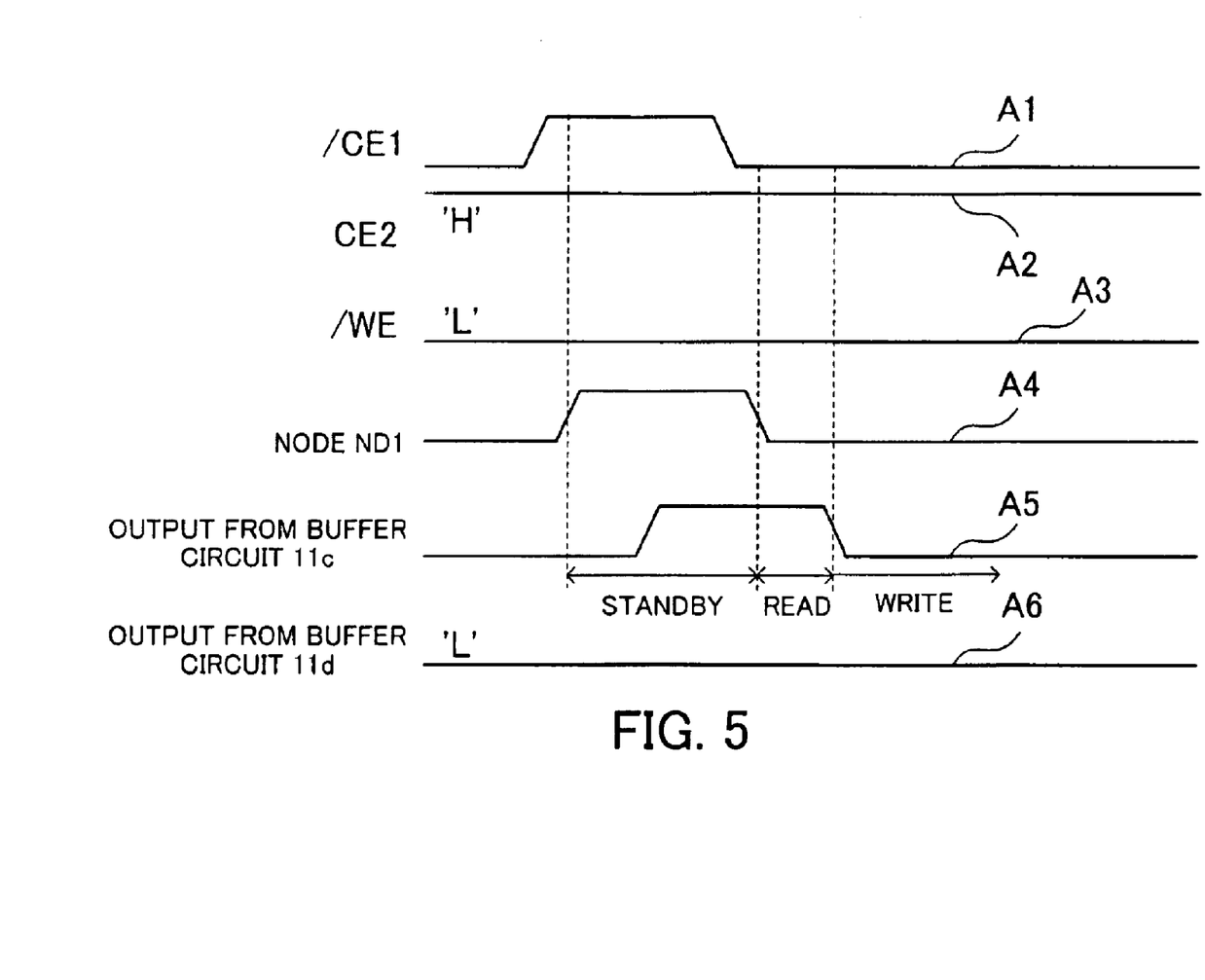
FIG. 5 is a view showing timing inside the PSRAM at write time.

FIG. 5 is a view showing timing inside the PSRAM at write time. A waveform A1 indicates the waveform of a signal which is being inputted to the terminal/CE1. A wave form A2 indicates the waveform of a signal which is being inputted to the terminal CE2. A waveform A3 indicates the waveform of a signal which is being inputted to the terminal /WE. A waveform A4 indicates the state of a signal at the node ND1. A waveform A5 indicates the waveform of a signal outputted from the buffer circuit 11c. A waveform A6 indicates the waveform of a signal outputted from the: buffer circuit 11d.

When the signal in the "L." state as shown by the waveform A1 is being inputted to the terminal /CE1 and the signal in the "H" state as shown by the waveform A2 is being inputted to the terminal CE2, the PSRAM is in a nonstandby state. As shown by the waveform A4, at this time the signal at the node ND1 (output from the OR circuit Z1) is in the "L" state.

The node ND1 is in the "L" state, so the transistor Q1 in the buffer circuit 11c turns on and the transistor Q4 in the buffer circuit 11c turns off. Therefore, the buffer circuit 11c outputs the state of the signal which is being inputted to the terminal /WE. The signal in the "L" state as shown by the waveform A3 is being inputted to the terminal /WE. Accordingly, the buffer circuit 11c outputs the signal in the "L" state as shown by the waveform A5.

The node ND1 is in the "L" state, so the transistor Q9 in the buffer circuit 11d turns on and the transistor Q12 in the buffer circuit 11d turns off. Therefore, the buffer circuit 11d outputs the state of the signal which is being inputted to the terminal /WE. The signal in the "L" state as shown by the waveform A3 is being inputted to the terminal /WE, so the buffer circuit 11d outputs the signal in the "L" state as shown by the waveform A6.

As shown by the waveform A1, the signal which is being inputted to the terminal /CE1 makes the transition to the "H" state. Then the PSRAM goes into a standby state. As shown by the waveform A4, at this time the state of the signal at the node ND1 makes the transition to the "H" state. The transition of the state of the signal at the node ND1 to the "H" state will lag behind that of the state of the signal which is being inputted to the terminal /CE1 because of delays in the buffer circuit 11a and the OR circuit Z1.

The node ND1 is in the "H" state, so the transistor Q1 in the buffer circuit 11c turns off and the transistor Q4 in the buffer circuit 11c turns on. Therefore, the buffer circuit 11c outputs the signal in the "H" state as shown by the waveform A5. The transition of the state of the signal outputted from the buffer circuit 11c will lag behind that of the state of the signal at the node ND1 because of a delay in the buffer circuit 11c itself.

The node ND1 is in the "H" state, so the transistor Q9 in the buffer circuit 11d turns off and the transistor Q12 in the buffer circuit 11d turns on. Therefore, the buffer circuit 11d outputs the signal in the "L" state as shown by the waveform A6.

As shown by the waveform A1, the signal which is being inputted to the terminal /CE1 makes the transition from the "H" state to the "L" state. Then the PSRAM goes into a nonstandby state. As shown by the waveform A4, at this time the state of the signal at the node ND1 makes the transition to the "L" state. The transition of the state of the signal at the node ND1 to the "L" state will lag behind that of the state of the signal which is being inputted to the terminal /CE1 because of delays in the buffer circuit 11a and the OR circuit Z1.

The node ND1 is in the "L" state, so the transistor Q1 in the buffer circuit 11c turns on and the transistor Q4 in the buffer circuit 11c turns off. Therefore, the buffer circuit 11c outputs the signal which is being inputted to the terminal /WE. The signal in the "L" state as shown by the waveform A3 is being inputted to the terminal /WE, so the buffer circuit 11c outputs the signal in the "L" state as shown by the waveform A5. The transition of the state of the signal outputted from the buffer circuit 11c will lag behind that of the state of the signal at the node ND1 because of a delay in the buffer circuit 11c itself.

The node ND1 is in the "L" state, so the transistor Q9 in the buffer circuit 11d turns on and the transistor Q12 in the buffer circuit 11d turns off. Therefore, the buffer circuit 11d outputs the signal which is being inputted to the terminal /WE. The signal in the "L" state as shown by the waveform A3 is being inputted to the terminal /WE, so the buffer circuit 11d outputs the signal in the "L" state as shown by the waveform A6.

As described above, when the PSRAM makes the transition from a standby state to a nonstandby state (when the signal which is being inputted to the terminal /CE1 makes the transition from the "H" state to the "L" state), the write signal (in the "L" state) is being inputted to the terminal /WE. Nevertheless, the buffer circuit 11c is outputting the signal (read signal) in the "H" state to the control circuit 40 because of delays in the buffer circuit 11a, the OR circuit Z1, and the buffer circuit 11c itself. Therefore, though write operation is being performed outside the PSRAM, data will be outputted from the memory core 50. However, the buffer circuit 11d is outputting the signal (write signal) in the "L" state to the data output control circuit 30. This state of the signal is opposite to that of the signal the buffer circuit 11c is outputting. Accordingly, the data output control circuit 30 prevents the read data outputted from the memory core 50 from being outputted to the outside (to the data terminal group T3), resulting in the avoidance of a bus fight.

Figure 6:
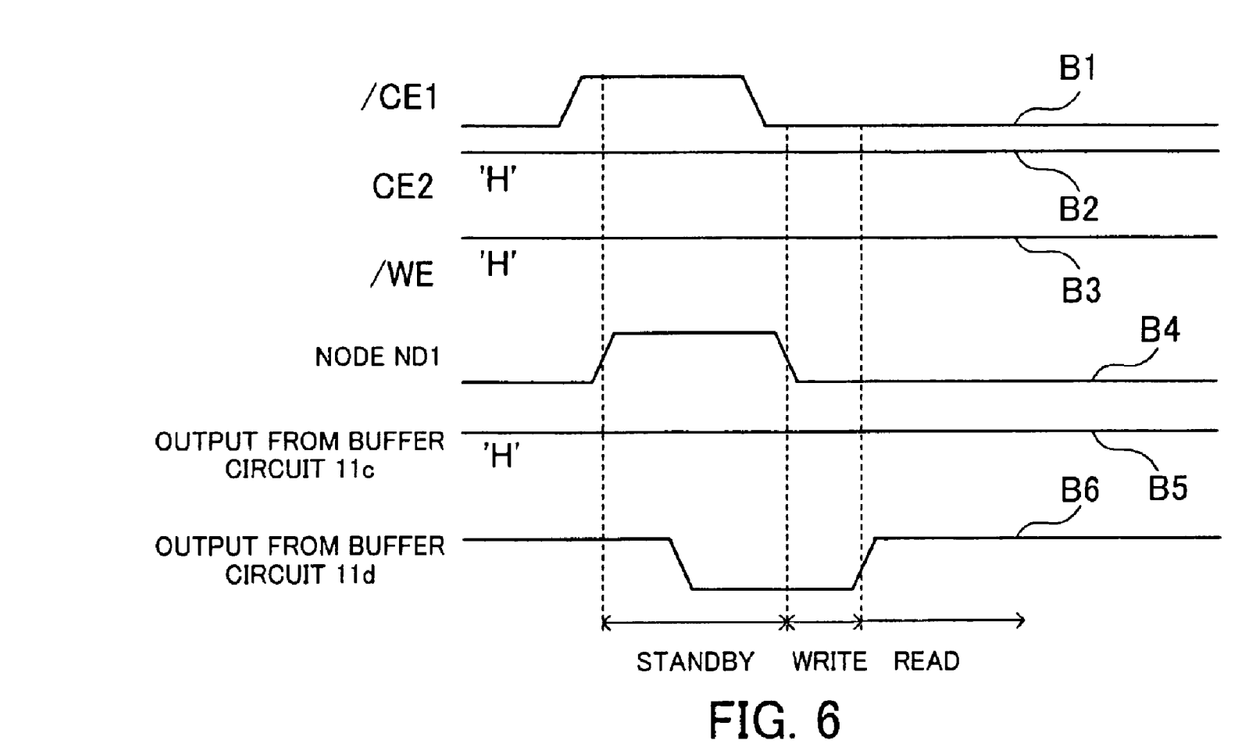
FIG. 6 is a view showing timing inside the PSRAM at read time.

FIG. 6 is a view showing timing inside the PSRAM at read time. A waveform B1 indicates the waveform of a signal which is being inputted to the terminal /CE1. A waveform B2 indicates the waveform of a signal which is being inputted to the terminal CE2. A waveform B3 indicates the waveform of a signal which is being inputted to the terminal /WE. A waveform B4 indicates the state of a signal at the node ND1. A waveform B5 indicates the waveform of a signal outputted from the buffer circuit 11c. A waveform B6 indicates the waveform of a signal outputted from the buffer circuit 11d.

When the signal in the "L" state as shown by the waveform B1 is being inputted to the terminal /CE1 and the signal in the "H" state as shown by the waveform B2 is being inputted to the terminal CE2, the PSRAM is in a nonstandby state. As shown by the waveform B4, at this time the signal at the node ND1 is in the "L" state.

The node ND1 is in the "L" state, so the transistor Q1 in the buffer circuit 11c turns on and the transistor Q4 in the buffer circuit 11c turns off. Therefore, the buffer circuit 11c outputs the state of the signal which is being inputted to the terminal /WE. The signal in the "H" state as shown by the waveform B3 is being inputted to the terminal /WE. Accordingly, the buffer circuit 11c outputs the signal in the "H" state as shown by the waveform B5.

The node ND1 is in the "L" state, so the transistor Q9 in the buffer circuit 11d turns on and the transistor Q12 in the buffer circuit 11d turns off. Therefore, the buffer circuit 11d outputs the state of the signal which is being inputted to the terminal /WE. The signal in the "H" state as shown by the waveform B3 is being inputted to the terminal /WE, so the buffer circuit 11d outputs the signal in the "H" state as shown by the waveform B6.

As shown by the waveform B1, the signal which is being inputted to the terminal /CE1 makes the transition to the "H" state. Then the PSRAM goes into a standby state. As shown by the waveform B4, at this time the state of the signal at the node ND1 makes the transition to the "H" state. The transition of the state of the signal at the node ND1 to the "H" state will lag behind that of the state of the signal which is being inputted to the terminal /CE1 because of delays in the buffer circuit 11a and the OR circuit Z1.

The node ND1 is in the "H1" state, so the transistor Q1 in the buffer circuit 11c turns off and the transistor Q4 in the buffer circuit 11c turns on. Therefore, the buffer circuit 11c outputs the signal in the "H" state as shown by the waveform B5.

The node ND1 is in the "H" state, so the transistor Q9 in the buffer circuit 11d turns off and the transistor Q12, in the buffer circuit 11d turns on. Therefore, the buffer circuit 11d outputs the signal in the "L" state as shown by the waveform B6. The transition of the state of the signal outputted from the buffer circuit 11d will lag behind that of the state of the signal at the node ND1 because of a delay in the buffer circuit 11d itself.

As shown by the waveform B1, the signal which is being inputted to the terminal /CE1 makes the transition from the "H" state to the "L" state. Then the PSRAM goes into a nonstandby state. As shown by the waveform B4, at this time the state of the signal at the node ND1 makes the transition to the "L" state. The transition of the state of the signal at the node ND1 to the "L" state will lag behind that of the state of the signal which is being inputted to the terminal /CE1 because of delays in the buffer circuit 11a and the OR circuit Z1.

The node ND1 is in the "L" state, so the transistor Q1 in the buffer circuit 11c turns on and the transistor Q4 in the buffer circuit 11c turns off. Therefore, the buffer circuit 11c outputs the signal which is being inputted to the terminal /WE. The signal in the "H" state as shown by the waveform B3 is being inputted to the terminal /WE, so the buffer circuit 11c outputs the signal in the "H" state as shown by the waveform B5.

The node ND1 is in the "L" state, so the transistor Q9 in the buffer circuit 11d turns on and the transistor Q12 in the buffer circuit 11d turns off. Therefore, the buffer circuit 11d outputs the signal which is being inputted to the terminal /WE. The signal in the "H" state as shown by the waveform B3 is being inputted to the terminal /WE, so the buffer circuit 11d outputs the signal in the "H" state as shown by the waveform B6.

As described above, when the PSRAM makes the transition from a standby state to a nonstandby state (when the signal which is being inputted to the terminal /CE1 makes the transition from the "H" state to the "L" state), the buffer circuit 11c is outputting the signal in the "H" state to the control circuit 40. This state of the signal is the same as that of the read signal (in the "H" state) which is being inputted to the terminal /WE. At this time the buffer circuit 11d outputs the signal (write signal) in the "L" state to the data output control circuit 30. This state of the signal is opposite to that of the signal the buffer circuit 11c is outputting. In this case, the data output control circuit 30 performs write operation (inputs data from the data terminal group T3 to the memory core 50) and read operation is performed outside the PSRAM. A bus fight therefore will not occur.

By the way, with the input circuit and the semiconductor integrated circuit having the input circuit which are disclosed in Japanese Unexamined Patent Publication No. 11-317076, two buffer circuits which input a common clock and which output an internal control signal are used. In this case, switching will be performed between these two buffer circuits according to an operation mode. That is to say, one buffer circuit outputs an internal control signal in a certain operation mode and the other buffer circuit outputs an internal control signal in another operation mode. These two buffer circuits are not activated (used) at the same time. The above buffer circuits 11c and 11d are the same as the above input circuit and the semiconductor integrated circuit having the input circuit in that they input a common read/write signal. However, the above buffer circuits 11c and 11d differ from the above input circuit and the semiconductor integrated circuit having the input circuit in that they are activated at the same time by a signal outputted from the OR circuit Z1 to output a signal in a certain state and that they are deactivated at the same time to stop the outputting of a signal in a certain state.

Moreover, the buffer circuits 11c and 11d are formed so that they will be adjacent, or the buffer circuits 11c and 11d are formed as the same buffer circuit. A common signal is inputted from the terminal /WE to the buffer circuits 11c and 11d. Therefore, by forming the buffer circuits 11c and 11d so that they will be adjacent, the length of each wiring can be shortened.

As has been described in the foregoing, in the present invention, the data output control circuit is controlled by an inverted signal obtained by inverting a logic signal inputted to the control circuit for controlling the reading of data from or the writing data to the memory core in order to control the inputting of data from or the outputting of data to the outside. This prevents a collision between data written from the outside and data read from the memory core.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory having a memory core for dynamically holding data, the semiconductor memory comprising:

a first buffer circuit for inputting an enable signal for controlling a standby state or a nonstandby state;

a second buffer circuit for outputting a predetermined logic signal or a read/write signal for controlling the reading of data from or the writing of data to the memory core in accordance with the enable signal;

a third buffer circuit for outputting an inverted signal obtained by inverting the logic signal or the read/write signal in accordance with the enable signal;

a control circuit for controlling the reading or writing of the data by the logic signal or the read/write signal outputted from the second buffer circuit; and a data output control circuit for controlling the inputting of the data from or the outputting of the data to the outside by the inverted signal or the read/write signal outputted from the third buffer circuit.

2. The semiconductor memory according to claim 1, wherein the second buffer circuit outputs the logic signal when an enable signal for controlling the standby state is being inputted.

3. The semiconductor memory according to claim 1, wherein the second buffer circuit outputs the read/write signal when an enable signal for controlling the nonstandby state is being inputted.

4. The semiconductor memory according to claim 1, wherein the third buffer circuit outputs the inverted signal when an enable signal for controlling the standby state is being inputted.

5. The semiconductor memory according to claim 1, wherein the third buffer circuit outputs the read/write signal when an enable signal for controlling the nonstandby state is being inputted.

6. The semiconductor memory according to claim 1, wherein the second buffer circuit and the third buffer circuit are adjacent.

7. The semiconductor memory according to claim 1, wherein the second buffer circuit and the third buffer circuit are activated or deactivated at the same time.

* * * * *